United States Patent
Martin et al.

(10) Patent No.: US 10,304,658 B2
(45) Date of Patent: May 28, 2019

(54) ELECTRON BEAM-INDUCED ETCHING

(71) Applicant: FEI Company, Hillsboro, OR (US)

(72) Inventors: Aiden Martin, Walnut Creek, CA (US); Milos Toth, Redfern (AU)

(73) Assignee: FEI Company, Hillsboro, OR (US)

( * ) Notice: Subject to any disclaimer, the term of this patent is extended or adjusted under 35 U.S.C. 154(b) by 267 days.

(21) Appl. No.: 14/802,648

(22) Filed: Jul. 17, 2015

(65) Prior Publication Data

US 2016/0020068 A1 Jan. 21, 2016

Related U.S. Application Data

(63) Continuation of application No. 13/914,312, filed on Jun. 10, 2013, now Pat. No. 9,123,506.

(51) Int. Cl.
*H01J 37/305* (2006.01)
*H01L 21/3065* (2006.01)
*H01L 21/465* (2006.01)
*C23F 4/02* (2006.01)
*H01J 37/30* (2006.01)

(52) U.S. Cl.
CPC ............ *H01J 37/3053* (2013.01); *C23F 4/02* (2013.01); *H01J 37/3002* (2013.01); *H01L 21/3065* (2013.01); *H01L 21/465* (2013.01); *H01J 2237/0206* (2013.01); *H01J 2237/2001* (2013.01); *H01J 2237/24445* (2013.01); *H01J 2237/2608* (2013.01); *H01J 2237/31732* (2013.01); *H01J 2237/31749* (2013.01)

(58) Field of Classification Search
None
See application file for complete search history.

(56) References Cited

U.S. PATENT DOCUMENTS

| | | | | |
|---|---|---|---|---|
| 4,162,401 A | * | 7/1979 | King | H01J 37/20 250/311 |
| 4,386,505 A | * | 6/1983 | Little | B21D 53/045 165/168 |
| 4,785,180 A | | 11/1988 | Mancuso et al. | |
| 4,785,182 A | * | 11/1988 | Mancuso | H01J 37/244 250/307 |
| 5,030,319 A | | 7/1991 | Nishino et al. | |
| 5,435,850 A | | 7/1995 | Rasmussen | |

(Continued)

FOREIGN PATENT DOCUMENTS

| | | |
|---|---|---|
| CN | 1977351 A | 6/2007 |
| CN | 102543639 A | 7/2012 |

(Continued)

OTHER PUBLICATIONS

Unknown, "Delineation Etching While FIB Milling", ip.com; Dec. 3, 2012, accessed Apr. 20, 2014, 27 pages.

(Continued)

*Primary Examiner* — Allan W. Olsen
(74) *Attorney, Agent, or Firm* — Bo Wang

(57) ABSTRACT

Beam-induced etching uses a work piece maintained at a temperature near the boiling point of a precursor material, but the temperature is sufficiently high to desorb reaction byproducts. In one embodiment, $NF_3$ is used as a precursor gas for electron-beam induced etching of silicon at a temperature below room temperature.

9 Claims, 5 Drawing Sheets

(56) References Cited

U.S. PATENT DOCUMENTS

| | | | |
|---|---|---|---|
| 5,539,211 A * | 7/1996 | Ohtoshi | B08B 7/0035 134/1.1 |
| 5,851,413 A | 12/1998 | Casella et al. | |
| 6,211,527 B1 | 4/2001 | Chandler | |
| 6,268,608 B1 | 7/2001 | Chandler | |
| 6,365,898 B1 * | 4/2002 | Sudraud | H01J 37/28 250/306 |
| 6,685,847 B2 * | 2/2004 | Sadayama | C23C 16/047 216/37 |
| 6,753,538 B2 * | 6/2004 | Musil | G03F 1/74 204/192.11 |
| 6,884,362 B2 * | 4/2005 | Tsung | G01N 1/32 216/2 |
| 6,972,412 B2 | 12/2005 | Scholtz et al. | |
| 7,452,477 B2 * | 11/2008 | Koops | H01J 37/3056 216/62 |
| 7,670,956 B2 | 3/2010 | Bret et al. | |
| 7,727,681 B2 * | 6/2010 | Stewart | G03F 1/74 204/157.15 |
| 8,524,139 B2 | 9/2013 | Toth et al. | |
| 8,598,542 B2 | 12/2013 | Toth et al. | |
| 8,617,668 B2 | 12/2013 | Toth et al. | |
| 8,778,804 B2 | 7/2014 | Randolph et al. | |
| 2003/0168001 A1 | 9/2003 | Sneh | |
| 2004/0262518 A1 * | 12/2004 | Lu | G01N 23/22 250/307 |
| 2005/0260354 A1 | 11/2005 | Singh et al. | |
| 2005/0263715 A1 * | 12/2005 | Nakasuji | H01J 37/141 250/396 ML |
| 2006/0228287 A1 * | 10/2006 | Zettl | B82Y 30/00 423/447.1 |
| 2007/0085007 A1 * | 4/2007 | Araki | H01J 37/265 250/310 |
| 2007/0158590 A1 * | 7/2007 | Hagiwara | G03F 1/74 250/492.21 |
| 2007/0243325 A1 | 10/2007 | Sneh | |
| 2008/0293832 A1 * | 11/2008 | Yokoi | G01N 1/42 516/98 |
| 2008/0315090 A1 * | 12/2008 | Nakasuji | H01J 37/141 250/306 |
| 2009/0084757 A1 | 4/2009 | Erokhin et al. | |
| 2010/0003404 A1 | 1/2010 | Sneh | |
| 2010/0108881 A1 * | 5/2010 | Toth | H01J 37/244 250/307 |
| 2010/0197142 A1 | 8/2010 | Randolph et al. | |
| 2010/0224592 A1 | 9/2010 | Toth et al. | |
| 2010/0258233 A1 | 10/2010 | Tonomura et al. | |
| 2011/0031394 A1 * | 2/2011 | Knowles | H01J 37/301 250/307 |
| 2011/0031655 A1 * | 2/2011 | Toth | B23K 26/12 264/400 |
| 2011/0070381 A1 | 3/2011 | Toth et al. | |
| 2011/0183444 A1 | 7/2011 | Auth et al. | |
| 2011/0183523 A1 | 7/2011 | Auth et al. | |
| 2011/0291010 A1 * | 12/2011 | Katane | H01J 37/244 250/310 |
| 2012/0003394 A1 | 1/2012 | Mulders et al. | |
| 2012/0112062 A1 * | 5/2012 | Novak | H01J 37/18 250/307 |
| 2012/0273458 A1 * | 11/2012 | Bret | B82Y 10/00 216/39 |
| 2013/0059446 A1 * | 3/2013 | Tabat | C23F 4/00 438/708 |
| 2013/0232783 A1 | 9/2013 | Tonomura et al. | |
| 2013/0248356 A1 | 9/2013 | Rue | |
| 2014/0255831 A1 * | 9/2014 | Hofmann | G03F 1/72 430/5 |
| 2014/0357088 A1 | 12/2014 | Rue et al. | |

FOREIGN PATENT DOCUMENTS

| | | |
|---|---|---|
| JP | S62076521 | 4/1987 |
| JP | H02256235 A | 10/1990 |
| JP | H03241741 A | 10/1991 |
| JP | H04037129 | 2/1992 |
| JP | H04162521 A | 6/1992 |
| JP | H04078268 U | 7/1992 |
| JP | 2010518583 A | 5/2010 |
| JP | 2011040747 A | 2/2011 |
| JP | 2013055336 A | 3/2013 |

OTHER PUBLICATIONS

K. Akita et al., "Electron-beam-induced Maskless CK1 Pattern Etching of GaAs", Semiconductor Science and Technology, 1991, 3 pages.

H. Fujioka et al., "Rapid Communication Measurements of the Energy Dependence of Electron Beam Assisted Etching of, and Deposition on, Silica", Journal of Physics D: Applied Physics, 1990, 3 pages.

Matthew Lassiter et al., "Inhibiting Spontaneous Etching of Nanoscale Electron Beam Induced Etching Features: Solutions for Nanoscale Repair of Extreme Ultraviolet Lithography Masks", J. Vac. Sci. Technol. B, May/Jun. 2008, 5 pages.

Gavin M. King et al., "Nanometer Patterning with Ice", Nano Letters, 2005, 4 pages.

John J. Hren et al., "Introduction to Analytical Electron Microscopy: Barriers to ARM: Contamination and Etching", Plenum Press, 1979, 17 pages.

Unknown, "Code of Practice Nitrogen Trifluoduide", retriveed Jun. 7, 2013, 28 pages.

Jules A. Gardener, "Ice-assisted Electron Beam Lithography of Graphene", Nanotechnology, 2012, 6 pages.

F. Bozso et al., "Electronic Excitation-induced Surface Chemistry and Electron-Beam-Assisted Chemical Vapor Deposition", Mat. Res. Soc. Symp. Proc., 1990, 8 pages.

* cited by examiner

ELECTRON BEAM-INDUCED ETCHING

This application is a continuation of U.S. application Ser. No. 13/914,312, filed Jun. 10, 2013, which is hereby incorporated by reference.

TECHNICAL FIELD

The present invention relates to charged particle beam processing, and in particular to beam-induced chemical processes.

BACKGROUND OF THE INVENTION

"Beam chemistry" referred to chemical reactions initiated by a beam, such as a charged particle beam or a laser beam. "Electron beam chemistry" includes electron beam-induced deposition (EBID) and electron beam-induced etching (EBIE) and is typically performed in a scanning electron microscope (SEM). In both these electron beam processes, molecules of a precursor gas are adsorbed onto a work piece surface. An electron beam is directed at the work piece, and the electrons dissociate the adsorbates, generating reaction products. In EBID, non-volatile reaction products remain on the substrate surface as a deposit, while volatile reaction products desorb. In EBIE, one or more of the precursor molecule decomposition products react with the work piece surface, generating volatile reaction products that desorb from the work piece, removing surface material. Similar processes occur in ion beam-induced deposition (IBID) and ion beam-induced etching (IBIE), although the much greater mass of the ions also causes material to be removed from the substrate by sputtering, that is, by momentum transfer from the energetic ions, without any chemical reaction. The mechanism by which the ion beam interacts with the adsorbate is thought to be different from the mechanism by which the electron beam reacts with the adsorbate.

To be useful as a precursor gas the molecules need to have very specific properties: they need to stick to the surface for a sufficient time to be dissociated, but must not form a thick layer that shields the surface from the beam, and they should not react spontaneously with the work piece surface material in the absence of the beam. In the case of etching, the precursor dissociation products should form a volatile compound with the substrate material and in the case of deposition, the precursor should decompose in the presence of the beam to deposit the desired material. Other reaction products should be volatile so that they do not remain on the surface and can be removed from the system by a vacuum pump.

Beam chemistry driven by a charged particle beam is typically performed in a vacuum chamber using a gas injection system having a capillary needle that directs gas toward the impact point of the beam. The gas expands rapidly and while the local gas pressure at the surface is sufficient to support beam-induced reactions, the pressure in the rest of the sample chamber is sufficiently low that secondary electrons can be detected using a conventional detector, such as the scintillator-photomultiplier combination commonly referred to as an Everhart-Thornley detector.

Electron beam chemistry can also be performed with a work piece in an environment flooded with the precursor gas, with most of the beam path separated from the gaseous environment by a pressure-limiting aperture. Because the gas pressure does not permit conventional secondary electron detection for imaging, imaging can be performed using gas cascade amplification in which secondary electrons from the sample are accelerated and ionize gas molecules. Electrons from the ionized gas molecules are accelerated and ionize other gas molecules, in a cascade that greatly amplifies the original secondary electron signal. A system in which the sample is maintained in a gaseous environment is typically called an environmental scanning electron microscope or a high-pressure scanning electron microscope (HPSEM). Gases that are not readily ionized are not useful for forming an image using gas cascade amplification. Gases that are susceptible to dielectric breakdown are also not useful for forming an image using gas cascade amplification.

$XeF_2$ has, to date, been the most commonly used precursor gas for beam-induced etching. However, $XeF_2$ has some undesirable effects. $XeF_2$ spontaneously etches many materials, including silicon and TaN. $XeF_2$ is not an optimal HPSEM imaging medium in that it provides poor charge stabilization and poor image quality during EBIE processing. $XeF_2$ is highly corrosive and toxic. $XeF_2$ cannot be mixed with many common gases used for residual carbon removal and surface species control. Moreover, large quantities of $XeF_2$ cause instability in some differentially pumped electron beam systems because of poor ion getter pumping of xenon.

An electron beam can also be used in electron beam lithography. The electron beam exposes photoresist as the beam scans in a pattern. Either exposed areas or unexposed areas, depending on the properties of the resist, are then removed, leaving a patterned photoresist layer. Ice can be used as a patterning material, with the electron beam causing the ice to sublimate in exposed areas, as described, for example, in King et al., "Nanometer Patterning with Ice," NANO Letters, Vol. 5, No. 6, pp. 1157-60. (2005). Areas from which the ice has been removed can be subject to further processing, such as diffusion or metallization, while other surface areas are protected by the ice layer.

In Gardener et al., "Ice-Assisted Electron Beam Lithography of Graphene," Nanotechnology 23 (2012) 185302, a thin layer of ice condensed on the surface acts as an EBIE precursor for etching a graphene layer underlying the ice. The electron beam is thought to induce a reaction between the carbon in the graphene and the hydrogen and oxygen in the ice to form volatile carbon compounds that leave the surface, removing the graphene.

In EBID, the dissociation product remains on the material, so the process can be carried out at low temperatures, at which the precursor gases adsorb more readily. In EBIE, however, the volatile reaction byproducts must desorb from the surface, and low temperatures reduce the thermal desorption rate of the reaction products and are therefore considered undesirable.

Bozso et al., "Electronic Excitation-Induced Surface Chemistry and Electron-Beam-Assisted Chemical Vapor Deposition," Mat. Res. Soc. Symp. Proc., Vol. 158, pp. 201-209 (1990) describes a method of depositing silicon, silicon nitride, silicon oxide, and silicon oxinitride films onto a silicon substrate using low energy EBID at a temperature of approximately 100 K (−173.degree. C.). The deposition method of Bozso is used to separate dissociation reactions caused by electrons from those caused by heat for more precise control over spatial growth and material composition.

U.S. Pat. Publication No. 2012/0003394 of Mulders et al. for "Beam-Induced Deposition at Cryogenic Temperatures," which is assigned to the assignee of the present invention, teaches choosing a precursor gas from a group of compounds having a melting point that is lower than the cryogenic temperature of the substrate and a sticking coefficient that is between 0 and 1 at the desired cryogenic temperature. This is thought to result in the precursor gas reaching equilibrium between precursor molecules adsorbed onto the substrate surface and precursor gas molecules desorbing from the substrate surface at the desired cryogenic temperature before more than a small number of monolayers of the gas are formed. Suitable precursor gases include alkanes, alkenes, or alkynes, or the branch derivatives of those compounds.

It would be useful to find a method for EBIE that is not associated with the problems described above.

SUMMARY OF THE INVENTION

An object of the present invention, therefore, is to provide an improved method for beam-induced etching.

A precursor gas is provided to a work piece surface that is maintained at a temperature near the boiling point of the precursor gas, which temperature provides high precursor surface coverage without condensation. The temperature also must be sufficiently high so as not to prevent desorption of reaction byproducts. In one preferred embodiment, the precursor is $NF_3$ and the work piece is silicon, and the work piece is cooled to well below room temperature, preferably to below −100° C.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Figure 1:
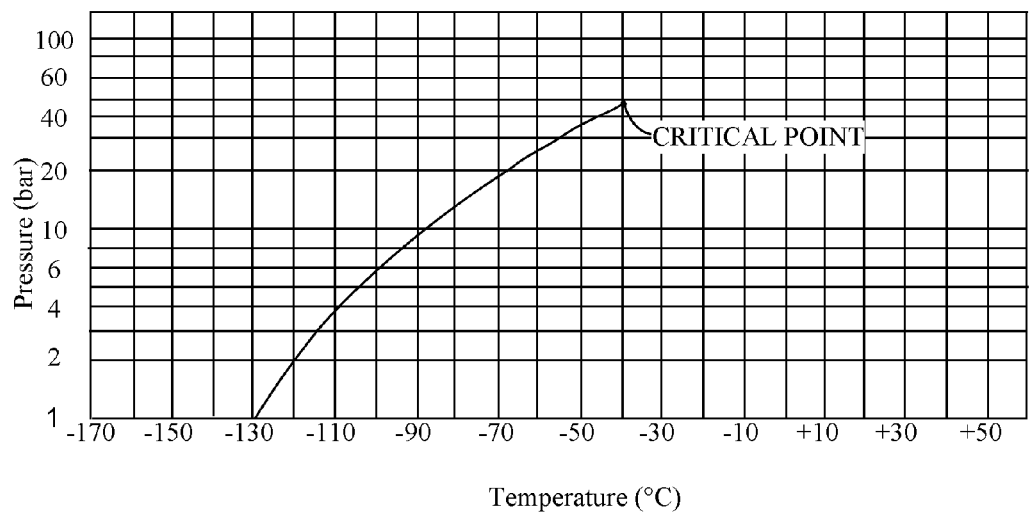
FIG. 1 shows a graph of the vapor pressure of $NF_3$ versus temperature.

EBIE allows removal of material from a substrate in a precise pattern with sub-micron accuracy. EBIE is most productive when the precursor covers the surface and the reaction products readily desorb from the surface to avoid redeposition and competition with precursor molecules for surface sites. While cooling the substrate is known to increase deposition rates for EBID by improving coverage of the surface by the precursor gas, it was thought that cooling the surface would decrease the EBIE rate, or stop etching altogether, by reducing the desorption rate of the reaction products. Applicants have found that, unexpectedly, the opposite occurs with certain gasses.

In some embodiments of the present invention, maximum precursor coverage on the surface is achieved by cooling the substrate to increase the residence time of the precursor molecules on the surface. That is, precursor molecules adsorb onto the surface and remain, that is, do not thermally desorb, for a longer period of time when the substrate is cooled. However, the temperature must not be so low as to inhibit desorption of the reaction products. Nor must the temperature be at or below the condensation point of the precursor gas. Condensed material collecting on the substrate surface interferes with desorption of reaction products from that same surface; if desorption does not proceed, redeposition of material and competition for surface sites can occur, preventing new precursor molecules from reaching the surface. Condensed material on the substrate surface also hinders imaging of features on that surface, making it hard to see when etching has proceeded far enough. Moreover, some etch precursor gases are very reactive and condensing them can result in violent reactions.

In some embodiments of the present invention, the substrate is cooled to maximize precursor coverage by minimizing the adsorbate desorption rate. The minimum useful temperature is just above the condensation point of the precursor. However, the temperature must not be so low as to inhibit desorption of the reaction product. Desorption occurs due to both thermal processes and to athermal processes, such electron stimulated desorption, making it difficult to determine a minimum temperature at which the reaction products desorb theoretically. The minimum temperature can be determined experimentally.

In some embodiments, the substrate is cooled to within 60° C. of the boiling point of the precursor gas, to within 40° C. of the boiling point, to within 20° C. of the boiling point, or to within 10° C. of the boiling point. In some embodiments, the substrate is cooled to below room temperature, to below −50° C., to below −100° C. or to below −125° C. In some embodiments, the temperature (in Kelvin scale) of the work piece surface is maintained to within 20 percent of the temperature (in Kelvin scale) of the boiling point of the precursor gas, within 10 precent or within 5 percent. It is the temperature difference between the substrate and the boiling point of the precursor, and not the absolute temperatures, that is important. For some precursors with high boiling points, cooling the substrate may be unnecessary.

One precursor gas that applicants have found to work well on a cooled substrate is $NF_3$, a relatively inert gas having a much lower toxicity than $XeF_2$. $NF_3$ does not spontaneously etch silicon, but upon activation by the electron beam, $NF_3$ reacts with a silicon substrate to form the reaction product $SiF_4$. $NF_3$ has similar oxidation properties to oxygen at temperatures less than 200° C., allowing it to be mixed with other gases, such as $NH_3$ and $N_2O$, during processing. $NH_3$ can remove residual carbon effectively during the etch process and can prevent formation of oxides that can act as an etch stop. In cases in which oxides mediate etching and are therefore desirable for the etch process, $N_2O$ can be mixed with $NF_3$ to regenerate the oxide layer. Many useful gases can be mixed with $NF_3$ without requiring a complete evacuation of one gas before introducing a second gas, that is, gas cycling, as required with more reactive gases. Because $NF_3$ is a gas at room temperature and can be stored in a pressurized container, there is negligible back diffusion of a gas mix to contaminate the gas source. Unlike $XeF_2$, which reacts with most gases including $NH_3$ and $N_2O$ at room temperature, $NF_3$ does not react with these gases to produce unwanted products. Nor does $NF_3$ leave non-volatile dissociation byproducts at the substrate surface, unlike other sources such as $CF_4$, $SiF_4$ or $BF_3$.

$NF_3$ also has a geometry and ionization cross-section that makes it a promising candidate for environmental scanning electron microscope-type imaging using gas cascade amplification imaging. Gas cascade amplification imaging provides efficient charge stabilization of the work piece, as charged gas particles diffuse to the work piece to neutralize charged. This is particularly advantageous when etching insulating material such as $SiO_2$. Gas cascade imaging allows reliable monitoring of the work piece while it is being etched.

Vapor pressures of gases are not well documented at conditions typically used in EBIE, that is, at pressures between about 10 Torr and 0.01 Torr. Data at just below atmospheric pressure is more readily available and can be used as a guide. FIG. 1 shows that $NF_3$ remains a gas at approximately $-129°$ C. at 760 Torr. At the much lower pressures used in an SEM, condensation is expected to occur at a lower temperature. Applicants have found experimentally that EBIE of silicon using $NF_3$ works well at a work piece temperature about $-159°$ C. and a pressure of about 0.04 Torr.

The silicon is thought to react with the $NF_3$ to produce $SiF_4$ and nitrogen. The only readily available vapor pressure data for the reaction product $SiF_4$ is at 760 Torr with condensation occurring at $-86°$ C. While one would suspect volatilization would not to occur during the process at $-159°$ C. due to its higher boiling point of $SiF_4$ compared to $NF_3$, the etch process still proceeds, indicating that electron stimulated desorption may play a role in desorption.

In another embodiment, $NF_3$ is used as a precursor gas to etch silicon carbide. This reaction is thought to be the same process as described above for silicon, but with the addition of carbon and therefore an additional reaction product $CF_4$ as well as the reaction product $SiF_4$. The boiling point of $CF_4$ is $-130°$ C. at 760 Torr, which is lower than the boiling point of $SiF_4$. One would expect that the limiting factor in regards to condensation of reaction products would be $SiF_4$. The work piece surface would be maintained at the same temperature as for silicon, as the precursor is the same and the desorption temperature is lower for $CF_4$.

In another embodiment, diamond is etched using $O_2$ as a precursor gas. The carbon in the diamond combines with the oxygen to produce $CO_2$ and/or CO. Oxygen condensation occurs at about $-215°$ C. at 4 Torr. $CO_2$ condensation occurs at about $-130°$ C. at 4 Torr. CO condenses at about $-210°$ C. at 25 Torr. When using $O_2$ as a precursor gas to etch diamond or other carbon, one would cool down the work piece to preferably $-130°$ C. and possibly lower to optimise the EBIE process.

Figure 2:
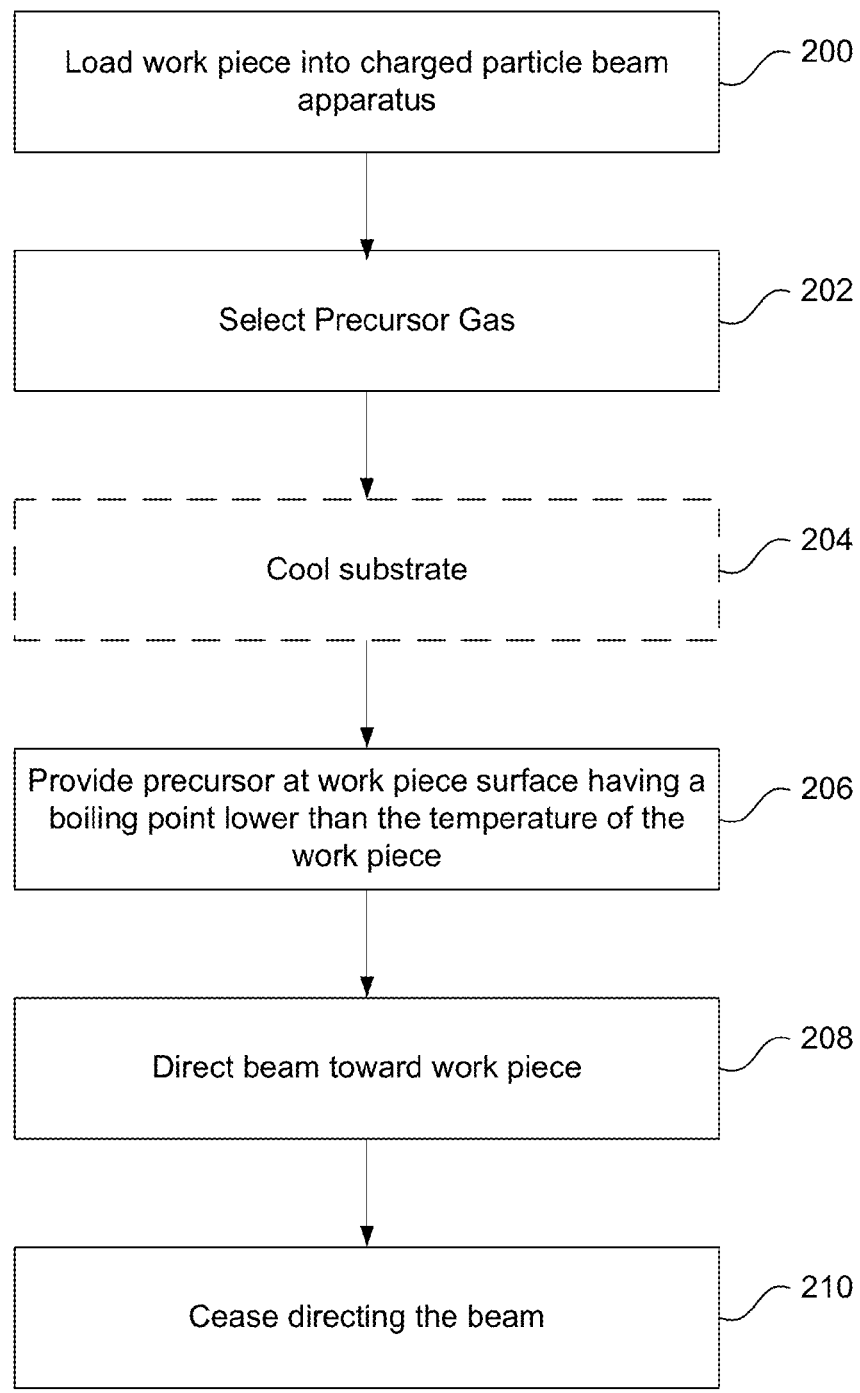
FIG. 2 is a flowchart showing the steps of a preferred embodiment of the present invention.

FIG. 2 illustrates the steps of a preferred EBIE process. The process starts in step 200, with loading a substrate into an apparatus, such as an SEM, a transmission electron microscope (TEM) or a laser system. In step 202, a precursor gas is selected. Optionally in step 204, the substrate is cooled to a temperature determined by the properties of the precursor gas chosen and the work piece material. Whether or not the substrate is cooled depends on the boiling temperature of the precursor molecules and the minimum temperature required to desorb reaction byproducts. The substrate is cooled to a temperature close to the boiling point to maximize precursor coverage on the surface while preventing condensation and still allowing desorption of reaction products. In step 206, the selected precursor gas, which has a boiling point lower than the temperature of the substrate surface, is provided at the substrate surface. The pressure in the work piece chamber can range from about $10^{-8}$ Torr when in an ultra-high vacuum system used with a gas injection system, to about 10 Torr when used in an environmental scanning electron microscope-type system. In step 208, the substrate surface is irradiated in a pattern with a beam, such as an electron beam, an ion beam, a cluster beam, or a neutral beam, in the presence of the precursor gas, so the precursor gas reacts in the presence of the particle beam to remove material from the substrate surface. The work piece is etched only where impacted by the beam, so a pattern can be etched having a resolution comparable to the spot size of the beam. For an electron beam, the beam energy is preferably between 1 keV to 30 keV (SEM), and up to about 300 keV (TEM). The electron beam current is preferably between 1 pA and 1 µA and the electron beam diameter or spot size at the work piece is preferably between about 1 nm to 10 microns. An ion beam can also be used for IBIE. For example, a beam of gallium ions from a liquid metal ion source can be used, as can a beam of argon or other ions from a plasma ion source, such as the Vion plasma ion source from FEI Company. The ion energy is preferably between about 1 keV to 50 keV, more preferably between 20 keV and 40 keV, and most preferable around 30 keV and a current of between about 1 pA to 1 microamp. In step 210, the beam ceases to be directed to the substrate.

Figure 3:
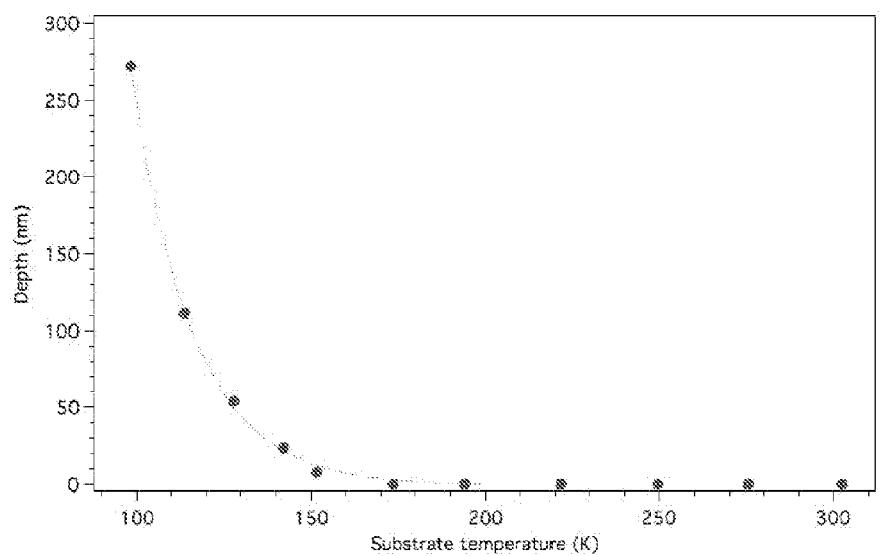
FIG. 3 shows a graph of etch depth versus substrate temperature for a 30 minute electron beam etch in an environment of $NF_3$.

FIG. 3 shows experimental results for EBIE performed using an SEM having a sample stage that is cooled by liquid nitrogen. Line 302 shows the depth of hole produced by directing an electron beam toward silicon in an $NF_3$ environment for 30 minutes at various temperatures ranging from room temperature, 302 K, to 98 K. The graph shows that etch rates increase by about forty times by cooling the substrate. This increase in etch rate is believed to be a result of increasing the available $NF_3$ on the surface through physisorption. The etch rate should scale with surface coverage of $NF_3$ in the region irradiated by electrons, and the coverage scales with reciprocal temperature. The prior art, on the other hand, includes enhancing etching by heating the substrate to ensure desorption of the reaction products, for example, using localized heating by a pulsed laser beam. Thus, this embodiment is contrary to conventional thinking.

Based on their boiling points and vapour pressures, the following precursor gases are also likely to greatly benefit from cooling below room temperature: oxygen ($O_2$), nitrous oxide ($N_2O$), hydrogen ($H_2$), ammonia ($NH_3$), chlorine ($Cl_2$), hydrogen chloride (HCl). Substrate constituents that cooling may be useful for include: boron ($BF_3$, $B_2H_6$) carbon (CO, $CO_2$, $CF_4$, $CH_4$), silicon ($SiF_4$, $SiH_4$), germanium ($GeH_4$, $GeF_4$), arsenic ($AsH_3$), phosphorus ($PF_3$, $PH_3$), tin ($SnH_4$), antimony ($SbH_3$), selenium ($SeF_6$), and sulphur ($SF_6$, $SO_2$). The molecules in brackets are potential etch reaction products which are highly volatile and will likely desorb at the lower temperatures used to accelerate EBIE. The work pieces to which the above constituents are relevant include a range of compositions such as silicon, diamond, boron-doped diamond, germanium, silicon carbide, silicon nitride, silicon-germanium alloys, boron nitride, boron phosphide & boron arsenide.

In the condensation method used in ice lithography, the precursor gas is applied in the form of a "pulse" because the condensate (ice) thickness grows continuously while precursor gas is present in the vacuum chamber. In preferred embodiments of the invention, the precursor is delivered continuously and the conditions are such as to prevent condensation. The precursor adsorbate thickness is self-limited by the adsorption/desorption kinetics, as in conventional room temperature EBID. The condensation method is not preferred because it requires multiple additional steps and calibration of condensate thickness. In the case of environmental SEM beam chemistry, a gas phase precursor is preferred so it can be used as an ESEM imaging gas. Imaging in "Ice Lithography" is limited due to the interaction of the electron beam with the condensed $H_2O$ layer. This greatly reduces the SEMs capability of imaging substrate surface features.

Optionally, one can also use a cold trap above or near the sample to remove residual $H_2O$ or hydrocarbons through condensation so as to increase cleanliness of the chamber and therefore improve the process reproducibility/quality.

Figure 4:
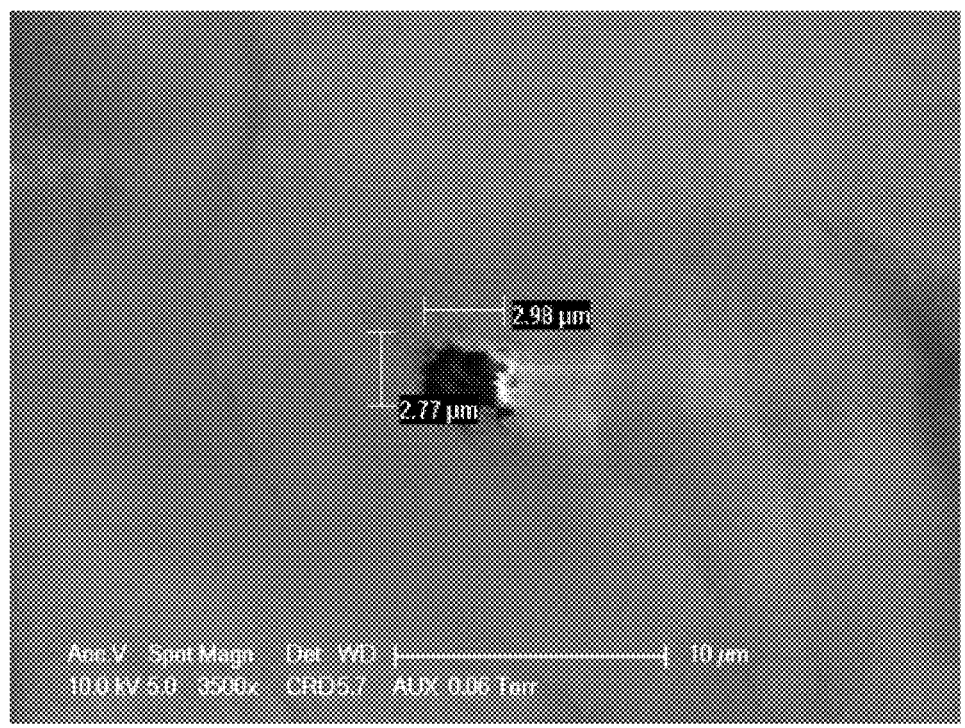
FIG. 4 shows an image formed using gas cascade amplification with the sample in an environment of $NF_3$.

FIG. 4 is a photomicrograph showing an example of an image of insulating silica aerogel formed using $NF_3$ as the gas for gas cascade amplification. Aerogels typically exhibit extreme, chronic charging artefacts. Little optimization was needed to form this image, demonstrating how effective the gas is at stabilising charging. $NF_3$ is an excellent imaging medium, both for signal amplification and for charge stabilization. It is much better than $XeF_2$, and similar in image quality to $NH_3$, which has been previously shown to be better than $H_2O$. The aerogel in FIG. 4 was etched using an electron beam in the presence of $NF_3$ mediated EBIE for about 5 to 10 minutes. The sample temperature was about −159° C. and the $NF_3$ pressure was about 0.04 Torr.

Figure 5:
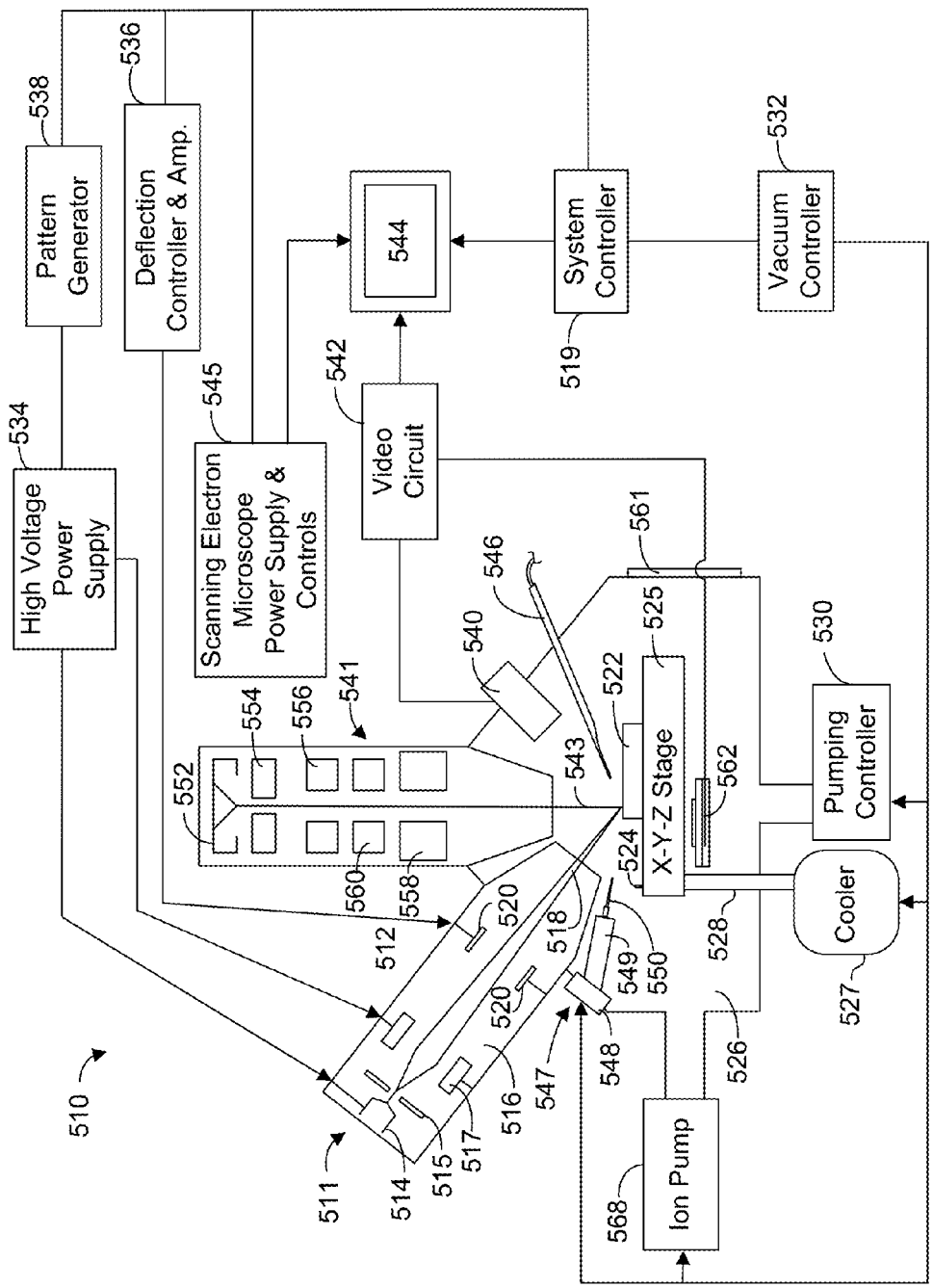
FIG. 5 shows schematically a typical dual beam system that can be used to implement some embodiments of the invention.

The present invention can be implemented in any beam-producing system that provides for providing a precursor gas at the work piece surface. For example, an electron beam system, an ion beam system, or a laser system can be used. FIG. 5 shows a typical dual beam system 510 suitable for practicing the present invention, with a vertically mounted SEM column and a focused ion beam (FIB) column mounted at an angle of approximately 52 degrees from the vertical. Suitable dual beam systems are commercially available, for example, from FEI Company, Hillsboro, Oreg., the assignee of the present application. While an example of suitable hardware is provided below, the invention is not limited to being implemented in any particular type of hardware.

A scanning electron microscope 541, along with power supply and control unit 545, is provided with the dual beam system 510. An electron beam 543 is emitted from a cathode 552 by applying voltage between cathode 552 and an anode 554. Electron beam 543 is focused to a fine spot by means of a condensing lens 556 and an objective lens 558. Electron beam 543 is scanned two-dimensionally on the specimen by means of a deflection coil 560. Operation of condensing lens 556, objective lens 558, and deflection coil 560 is controlled by power supply and control unit 545.

Electron beam 543 can be focused onto substrate 522, which is on movable X-Y stage 525 within lower chamber 526. Stage 525 preferably is connected to a cooler 527, such as a source of liquid nitrogen or a Peltier cooler, connected to the stage 525 by a thermal conduit 528. When the electrons in the electron beam strike substrate 522, secondary electrons are emitted. These secondary electrons are detected by secondary electron detector 540 as discussed below. STEM detector 562, located beneath the TEM sample holder 524 and the stage 525, can collect electrons that are transmitted through the sample mounted on the TEM sample holder as discussed below.

Dual beam system 510 also includes focused ion beam (FIB) system 511 which comprises an evacuated chamber having an upper neck portion 512 within which are located an ion source 514 and a focusing column 516 including extractor electrodes and an electrostatic optical system. The axis of focusing column 516 is tilted 52 degrees from the axis of the electron column. The ion column 512 includes an ion source 514, an extraction electrode 515, a focusing element 517, deflection elements 520, and a focused ion beam 518. Ion beam 518 passes from ion source 514 through column 516 and between electrostatic deflection means schematically indicated at 520 toward substrate 522, which comprises, for example, a semiconductor device positioned on movable X-Y stage 525 within lower chamber 526.

Stage 525 can also support one or more TEM sample holders 524 so that a sample can be extracted from the semiconductor device and moved to a TEM sample holder. Stage 525 can preferably move in a horizontal plane (X and Y axes) and vertically (Z axis). Stage 525 can also tilt approximately sixty (60) degrees and rotate about the Z axis. In some embodiments, a separate TEM sample stage (not shown) can be used. Such a TEM sample stage will also preferably be moveable in the X, Y, and Z axes. A door 561 is opened for inserting substrate 522 onto X-Y stage 525 and also for servicing an internal gas supply reservoir, if one is used. The door is interlocked so that it cannot be opened if the system is under vacuum.

An ion pump 568 is employed for evacuating neck portion 512. The chamber 526 is evacuated with turbomolecular and mechanical pumping system 530 under the control of vacuum controller 532. The vacuum system provides within chamber 526 a vacuum of between approximately $1\times10^{-7}$ Torr and $5\times10^{-4}$ Torr. If an etch assisting, an etch retarding gas, or a deposition precursor gas is used, the chamber background pressure may rise, typically to about $1\times10^{-5}$ Torr.

The high voltage power supply provides an appropriate acceleration voltage to electrodes in ion beam focusing column 516 for energizing and focusing ion beam 518. When the ion beam strikes substrate 522, material is sputtered, that is physically ejected, from the sample. Alternatively, ion beam 518 can decompose a precursor gas to deposit a material.

High voltage power supply 534 is connected to liquid metal ion source 514 as well as to appropriate electrodes in ion beam focusing column 516 for forming an approximately 1 keV to 60 keV ion beam 518 and directing the same toward a sample. Deflection controller and amplifier 536, operated in accordance with a prescribed pattern provided by pattern generator 538, is coupled to deflection plates 520 whereby ion beam 518 may be controlled manually or automatically to trace out a corresponding pattern on the upper surface of substrate 522. In some systems the deflection plates are placed before the final lens, as is well known in the art. Beam blanking electrodes (not shown) within ion beam focusing column 516 cause ion beam 518 to impact onto a blanking aperture (not shown) instead of substrate 522 when a blanking controller (not shown) applies a blanking voltage to the blanking electrode.

The liquid metal ion source 514 typically provides a metal ion beam of gallium. The source typically is capable of being focused into a sub one-tenth micrometer wide beam at substrate 522 for either modifying the substrate 522 by ion milling, enhanced etching, material deposition, or for the purpose of imaging the substrate 522.

A charged particle detector 540, such as an Everhart Thornley or multi-channel plate, used for detecting secondary ion or electron emission is connected to a video circuit 542 that supplies drive signals to video monitor 544 and receiving deflection signals from controller 519. The location of charged particle detector 540 within lower chamber 526 can vary in different embodiments. For example, a charged particle detector 540 can be coaxial with the ion beam and include a hole for allowing the ion beam to pass. In other embodiments, secondary particles can be collected through a final lens and then diverted off axis for collection.

A micromanipulator 547, such as the AutoProbe 200™ from Omniprobe, Inc., Dallas, Tex., or the Model MM3A from Kleindiek Nanotechnik, Reutlingen, Germany, can precisely move objects within the vacuum chamber. Micromanipulator 547 may comprise precision electric motors 548 positioned outside the vacuum chamber to provide X, Y, Z, and theta control of a portion 549 positioned within the vacuum chamber. The micromanipulator 547 can be fitted with different end effectors for manipulating small objects. In the embodiments described herein, the end effector is a thin probe 550.

A gas delivery system 546 extends into lower chamber 526 for introducing and directing a gaseous vapor toward substrate 522. U.S. Pat. No. 5,851,413 to Casella et al. for "Gas Delivery Systems for Particle Beam Processing," assigned to the assignee of the present invention, describes a suitable gas delivery system 546. Another gas delivery system is described in U.S. Pat. No. 5,435,850 to Rasmussen for a "Gas Injection System," also assigned to the assignee of the present invention. For example, iodine can be delivered to enhance etching, or a metal organic compound can be delivered to deposit a metal.

A system controller 519 controls the operations of the various parts of dual beam system 510. Through system controller 519, a user can cause ion beam 518 or electron beam 543 to be scanned in a desired manner through commands entered into a conventional user interface (not shown). Alternatively, system controller 519 may control dual beam system 510 in accordance with programmed instructions. In some embodiments, dual beam system 510 incorporates image recognition software, such as software commercially available from Cognex Corporation, Natick, Mass., to automatically identify regions of interest, and then the system can manually or automatically extract samples in accordance with the invention. For example, the system could automatically locate similar features on semiconductor wafers including multiple devices, and take samples of those features on different (or the same) devices.

Embodiments of the invention can also be implemented using a high pressure SEM that uses gas cascade amplification. Such systems are described, for example, in U.S. Pat. No. 4,785,182 to Mancuso et al., entitled "Secondary Electron Detector for Use in a Gaseous Atmosphere."

Figure 6:
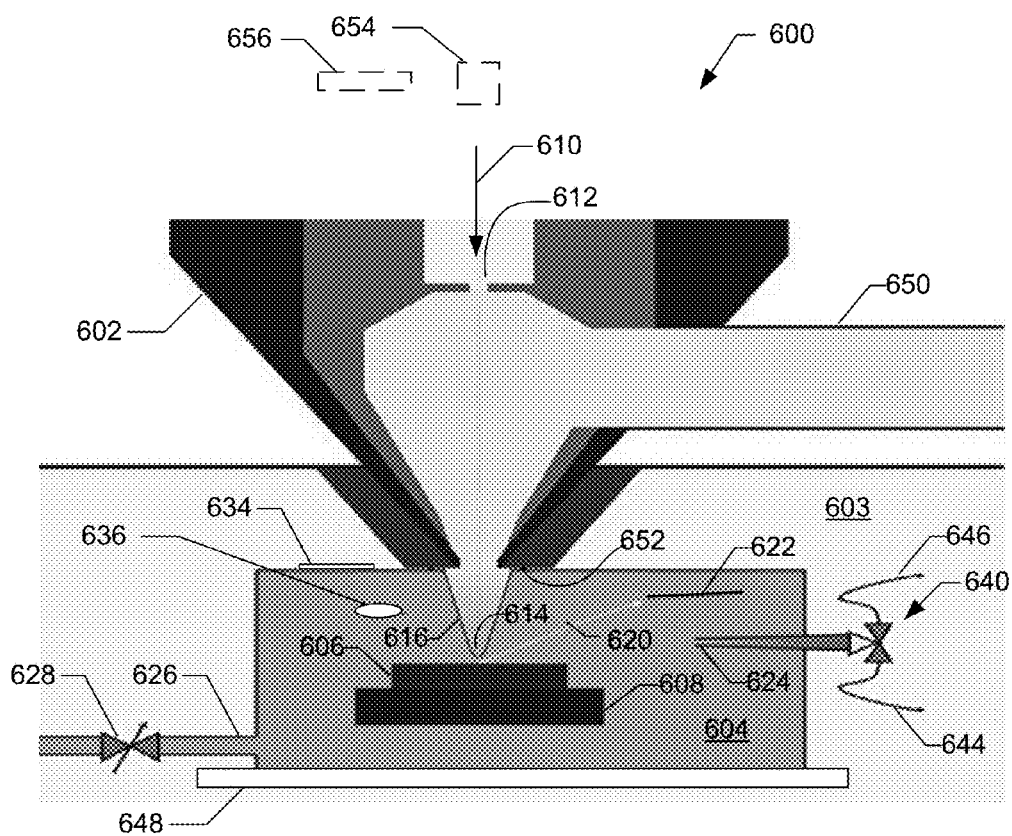
FIG. 6 shows schematically a system having an environmental cell that can be used to implement some embodiments of the invention.

FIG. 6 shows a system using an environmental cell that can be filled with the precursor gas comprising a particle-optical apparatus 600 having a pinhole magnetic objective lens 602, a sample chamber 603 having within it a sample cell 604 for maintaining a sample 606 at a relatively high pressure on a stage 608. A particle source (not shown) provides a primary electron beam 610 that passes through an upper pressure limiting aperture (PLA) 612 and a lower PLA 614 at the bottom of a cone 616. Cone 616 reduces the path of the electron beam 610 through the gas in cell 604. Secondary electrons 620 emitted from the sample are detected by a secondary electron detector 622 built into cell 604 and positioned to enable detection inside cell 604.

This system uses a detector 622 positioned apart from the specimen stage. The distance between detector 622 and the sample provides a sufficient electron path for collisions between electrons leaving the sample and the gas to significantly amplify the electron current. For example, there are typically more than 300 electrons, more than 500 electrons, or more than 1000 electrons reaching detector 622 for each electron leaving the sample. Detector 622 detects a current induced by the flow of charge in the gas cascade to form an image. In other embodiments, a photon detector can be used to detect photons emitted from the cascade to form an image. The photons are emitted by excited ions, fragments or neutrals, either in the gas or upon contact with surfaces inside the sample cell or the sample chamber.

A gas input 624 and a gas output 626 regulate the flow rate and pressure of a process or imaging gas inside the sample cell 604. A source of a precursor or imaging gas, such as $NF_3$, can be provided through gas input 624. Gas output 626 is connected through a leak valve 628 to a roughing pump (not shown). A controlled leak through valve 628 and the relatively small volume of cell 604 compared to the volume of sample chamber 603 provides for rapid switching between different processing gases, for example, to switch between HPSEM beam chemistry mode and HPSEM imaging mode. Particle-optical apparatus 600 can function at relatively high pressure, that is, greater than 20 Torr (26 mbar). Particle-optical apparatus 600 can also function at 50 Torr (65 mbar) or higher. In some embodiments, the pressure in the cell 604 is greater than 10 mTorr, while the pressure in the sample chamber 603 is less than 10 m Torr.

Secondary electron detector 622, which is shown in the form of a needle but can also have different geometries such as a ring or a plate, is electrically biased to preferably more than 100 V, more preferably greater than 300 V, and most preferably about 500 volts to attract secondary electrons, which collide with gas molecules between sample 606 and secondary electron detector 622 to create an ionization cascade to amplify the secondary electron signal. The combination of cone 616 with the configuration of secondary electron detector 622, which is positioned outside of the cone, allows for a sufficient secondary electron path within the gas to provide adequate secondary electron signal amplification, while maintaining a short primary electron path through the gas. The secondary electron path from the sample to the detector is preferably greater than 2 mm. An optically transparent window 634 allows a user to observe the sample through an optical microscope (not shown) using a lens 636 positioned between window 634 and sample 606. The optical window 634 allows system 600 to provide a wide field view, while still providing a short gas path length and a low rate of gas leakage into the column, which improves resolution and image signal-to-noise ratio, and protects the column from corrosive gases.

Gas input 624 includes a valve arrangement 640 that allows for rapid switching between multiple gas feeds, such as a one or more process gas feeds 644 and an imaging gas feed 646. A duct 650 allows for evacuation of gases that pass through PLA 614, thereby helping to maintain a lower column pressure above upper PLA 612. A stage 648, which can be the stage from a convention HPSEM or low pressure SEM into which cell 604 is placed, allows the position of cell 604 to be adjusted so that PLA 614 is aligned with the axis of electron beam 610, while stage 608 allows movement of the sample 606 within cell 604 so that a region of interest on the sample 606 can be positioned under the electron beam 610. A seal 652, such as a Viton o-ring or a Teflon seal, preferably provides a gas-tight seal between lens 602 and cell 604 to prevent gases from cell 604 entering sample chamber 603. Seal 652 could also be a non-gas tight seal provided by a small gap that acts as a gas flow restriction between the sub-chamber and sample chamber 603. Other systems that can use gas cascade amplification are described, for example, in U.S. Pat. No. 4,785,182 to Mancuso et al., entitled "Secondary Electron Detector for Use in a Gaseous Atmosphere" and U.S. Pat. No. 6,972,412 for "Particle-Optical Device and Detection Means," to Scholtz et al., which is assigned to the assignee of the present invention.

The invention is not limited to using a gas cascade detector in the cell. Conventional detectors, such as a gas luminescence detectors or a through-the-lens style detector positioned about the PLA could also be used. In a through-the-lens style detector, voltages are applied to draw the secondary particles back through the final lens, where they can be detected by an on-axis or off axis collection system, such as a multichannel plate or a scintillator photomultiplier. FIG. 6 shows an optional secondary electron deflector 654, such as a Wien filter, that defects secondary electrons away from the primary beam axis and into detector 656, while passing the primary beam 610 without deviation.

While the description above uses the term "etch precursor" and "deposition precursor," skilled persons will recognize that many precursors and precursor gas mixtures can either etch or deposit, depending on the gas flux and the beam density Some embodiments of the invention provide a method of charged particle beam etching, comprising cooling a work piece surface to below room temperature; exposing a substrate surface to a precursor gas, the precursor gas being chosen from a group of compounds having a boiling point lower than the temperature of the substrate surface; and irradiating the substrate surface with a charged particle beam in the presence of the precursor gas, the precursor gas reacting in the presence of the particle beam to remove material from the substrate surface.

In some embodiments, exposing a substrate surface to a precursor gas includes exposing the substrate surface the precursor gas comprises $NF_3$. In some embodiments in which the precursor gas comprises $NF_3$, the work piece comprises silicon.

In some embodiments in which the precursor gas comprises $NF_3$, exposing a substrate surface to a precursor gas includes exposing the substrate surface to a mixture of $NF_3$ and a gas that inhibits the growth of an oxide. In some embodiments in which the precursor gas comprises $NF_3$, exposing a substrate surface to a precursor gas includes exposing the substrate surface to a mixture of $NF_3$ and a carbon-etching gas. In some embodiments in which the precursor gas comprises $NF_3$, exposing a substrate surface to a precursor gas includes exposing the substrate surface to a mixture of $NF_3$ and a gas that promotes the growth of an oxide. In some embodiments in which the precursor gas comprises $NF_3$, exposing a substrate surface to a precursor gas includes exposing the substrate surface to a mixture of $NF_3$ and $NH_3$. In some embodiments in which the precursor gas comprises $NF_3$, exposing a substrate surface to a precursor gas includes exposing the substrate surface to a mixture of $NF_3$ and $N_2O$.

In some embodiments, cooling a work piece surface to less than room temperature includes cooling the work piece surface to within 50° C. of the boiling point of the precursor. In some embodiments, cooling a work piece surface to less than room temperature includes cooling the work piece surface to within 20° C. of the boiling point of the precursor. In some embodiments, cooling a work piece surface to less than room temperature includes cooling the work piece surface to less than minus 100° C. In some embodiments, cooling a work piece surface to less than room temperature includes cooling the work piece surface to within 15 percent of the boiling point on the Kelvin scale of the precursor gas. In some embodiments, the precursor gas comprises a compound having molecules that will adsorb to the substrate surface and dissociate in the presence of the particle beam, thereby forming reactive fragments which react with the substrate surface to form reaction products which desorb from the substrate surface.

In some embodiments, the precursor gas comprises oxygen, nitrous oxide, hydrogen, ammonia, chlorine, or hydrogen chloride. In some embodiments, the work piece comprises boron, carbon, silicon, germanium, arsenic, phosphorus, tin, antimony, selenium, or sulphur.

Some embodiment provide a method of forming an image of a work piece, comprising: directing an electron beam toward the work piece, the impact of the electron beam causing the emission of secondary electrons; accelerating the secondary electrons in a gas containing $NF_3$ to cause an ionization cascade to amplify the secondary electron signal; detecting the amplified secondary electron signal; and forming an image of the work piece using the amplified secondary electron signal.

In some embodiments, the method includes cooling the work piece to below room temperature.

Some embodiments provide a method of charged particle beam etching, comprising: selecting a precursor gas for beam-induced etching of a work piece; maintaining a work piece surface at a temperature within 100° C. above the boiling point of the precursor gas; exposing a substrate surface to the precursor gas, the precursor gas being chosen from a group of compounds having a boiling point lower than the temperature of the substrate surface; irradiating the substrate surface with a charged particle beam in the presence of the precursor gas, the precursor gas reacting in the presence of the particle beam to remove material from the substrate surface.

Some embodiments of the invention provide a charged particle beam system for processing a work piece, comprising: a charged particle source for producing a primary beam of charged particles for irradiating said sample; a focusing lens for focusing the charged particles onto a work piece; an electrode for accelerating secondary electrons generated from the impact of the charged practice beam; and a container for enclosing $NF_3$, the electrode accelerating the secondary electrons though the $NF_3$ to ionize the $NF_3$ in ionization cascade to amplify the number of secondary electrons for detection.

In some embodiments, the container for enclosing the $NF_3$ comprises a sample vacuum chamber. In some embodiments, the container for enclosing the $NF_3$ comprises an environmental cell. In some embodiments, the container for enclosing the $NF_3$ comprises an ionization tube.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of forming an image of a work piece, comprising:
   flooding an environment surrounding the work piece with a gas containing molecules of $NF_3$;
   cooling the work piece to below room temperature;
   directing an electron beam toward the work piece, the impact of the electron beam causing the emission of secondary electrons from the work piece into the gas;
   causing a cascade ionization of the gas by accelerating the secondary electrons in the gas, wherein the cascade ionization of the gas amplifies the secondary electron signal;
   detecting the amplified secondary electron signal; and
   forming an image of the work piece using the amplified secondary electron signal.

2. The method of claim 1 in which the work piece comprises silicon.

3. The method of claim 2, wherein the work piece comprises $SiO_2$.

4. The method of claim 1 in which the work piece comprises boron, carbon, silicon, germanium, arsenic, phosphorus, tin, antimony, selenium, or sulphur.

5. A method of processing a silicon-containing work piece, the method comprising:
   monitoring a work piece comprising silicon according to the method of claim 1 while carrying out charged particle beam-induced etching on the work piece,
   wherein the gas containing the $NF_3$ molecules functions as an etch precursor gas for the charged particle beam-induced etching.

6. The method of claim 5, wherein the work piece comprises $SiO_2$.

7. A method of forming an image of a work piece, comprising:
   cooling the work piece to a temperature below 100° C.
   directing an electron beam toward the work piece, the impact of the electron beam causing the emission of secondary electrons;
   accelerating the secondary electrons in a gas containing $NF_3$ to cause an ionization cascade to amplify the secondary electron signal;
   detecting the amplified secondary electron signal; and
   forming an image of the work piece using the amplified secondary electron signal.

8. The method of claim 7 in which the work piece comprises silicon.

9. The method of claim 7 in which the work piece comprises boron, carbon, silicon, germanium, arsenic, phosphorus, tin, antimony, selenium, or sulphur.

* * * * *